United States Patent
Gorbics

(10) Patent No.: US 8,330,758 B2
(45) Date of Patent: Dec. 11, 2012

(54) STATISTICALLY-BASED DISPLAY PROCESSING

(75) Inventor: Mark Gorbics, Franklin Lakes, NJ (US)

(73) Assignee: Teledyne LeCroy, Inc., Thousand Oaks, CA (US)

( * ) Notice: Subject to any disclaimer, the term of this patent is extended or adjusted under 35 U.S.C. 154(b) by 1252 days.

(21) Appl. No.: 12/117,194

(22) Filed: May 8, 2008

(65) Prior Publication Data

US 2009/0309879 A1    Dec. 17, 2009

(51) Int. Cl.
*G06T 11/20* (2006.01)
(52) U.S. Cl. .............. 345/440; 73/465; 455/148; 702/66
(58) Field of Classification Search .................. None
See application file for complete search history.

(56) References Cited

U.S. PATENT DOCUMENTS

| | | | |
|---|---|---|---|
| 4,202,340 A * | 5/1980 | Langer et al. | 607/5 |
| 4,873,647 A * | 10/1989 | Banki et al. | 716/102 |
| 5,003,248 A * | 3/1991 | Johnson | 324/121 R |
| 5,995,117 A * | 11/1999 | Dobyns et al. | 345/441 |
| 6,151,010 A | 11/2000 | Miller et al. | |
| 6,333,732 B1 * | 12/2001 | Gerlach et al. | 345/440.1 |
| 6,571,185 B1 * | 5/2003 | Gauland et al. | 702/68 |
| 7,216,046 B2 | 5/2007 | Agoston et al. | |
| 7,638,751 B2 * | 12/2009 | Dauler et al. | 250/214 R |
| 7,952,545 B2 * | 5/2011 | Benjamin et al. | 345/87 |

\* cited by examiner

*Primary Examiner* — James A Thompson
*Assistant Examiner* — David H Chu
(74) *Attorney, Agent, or Firm* — Gordon Kessler

(57) ABSTRACT

In exemplary embodiments, a waveform processor system may update pixel state information as a function of current pixel state information (e.g., intensity, color) by comparing a randomized value to a set of predetermined threshold values that correspond to different permitted pixel states. In an illustrative example, each time a display screen is updated, the image may represent multiple (e.g., 2000) triggered sweeps of the waveform. For each triggered sweep, the waveform data is associated with specific pixels on the display screen. To determine how to update each pixel's state (e.g., brightness, color) for the next screen update, each waveform hit on a pixel may initiate a comparison between a randomized value (e.g., pseudorandom number) and the predetermined threshold value for the pixel's current pixel state. In some examples, the pixel state may be increased to the next level if the randomized value exceeds the predetermined threshold value.

24 Claims, 6 Drawing Sheets

200

| Bin (n) | Transition Vector | Probability |
|---|---|---|
| 0 | $i_0$ | 100% |
| 1 | $i_1$ | 10% |
| 2 | $i_2$ | 1% |
| 3 | $i_3$ | 0.1% |
| 4 | $i_4$ | 0.01% |
| 5 | $i_5$ | 0.001% |
| 6 | $i_6$ | 0.0001% |
| 7 | $i_7$ | 0% |

| Bin (n) | Fade Vector | Probability |
|---|---|---|
| 0 | $f_0$ | 0% |
| 1 | $f_1$ | 100% |
| 2 | $f_2$ | 10% |
| 3 | $f_3$ | 1% |
| 4 | $f_4$ | 0.1% |
| 5 | $f_5$ | 0.01% |
| 6 | $f_6$ | 0.001% |
| 7 | $f_7$ | 0.0001% |

| Bin (n) | Grayscale | Inverted Grayscale | Grayscale Anomaly Highlight |
|---|---|---|---|
| 0 | 0 | 255 | 0 |
| 1 | 64 | 224 | 255 |
| 2 | 96 | 192 | 32 |
| 3 | 128 | 160 | 64 |
| 4 | 160 | 128 | 96 |
| 5 | 192 | 96 | 128 |
| 6 | 224 | 64 | 160 |
| 7 | 255 | 0 | 192 |

| Bin (n) | Grayscale | Rainbow | Color Anomaly Highlight |
|---|---|---|---|
| 0 | Black | Black | Black |
| 1 | DimGray | Violet | Red |
| 2 | DarkGray | Indigo | DimGray |
| 3 | Gray | Blue | DarkGray |
| 4 | Silver | Green | Gray |
| 5 | LightGray | Yellow | Silver |
| 6 | Gainsboro | Orange | LightGray |
| 7 | White | Red | Gainsboro |

FIG. 6B

STATISTICALLY-BASED DISPLAY PROCESSING

TECHNICAL FIELD

Various embodiments relate to processing waveform data for display.

BACKGROUND

Measurement instruments, such as oscilloscopes, may be used to view periodic signals. In some cases, the signals may vary from period to period. For example, in the case of communications signals a periodic carrier signal may be modulated with another signal for conveying information. Periodic signals may also include transient signals, jitter, and/or noise.

An oscilloscope may be used to display waveform images. Waveform images can be produced directly from an analog signal, or from digitized samples of an analog waveform.

Some display devices (e.g., analog oscilloscopes) display waveform images by controlling vertical deflection of a beam of electrons that is being swept horizontally across a phosphor-based screen. As waveforms are traced on the screen, the areas of the phosphorous screen traced by the beam begin to glow. The glow generally persists long enough to enhance visual perceptibility, but fades over time. Areas of the screen that are traced often may glow more brightly than areas that are traced less often. After an area is traced, the glow may begin to fade over time. A user may use this behavior to visualize a collection of waveforms and see the periodic waveform as a bright trace and see modulated and/or noise signals as a region of reduced brightness around the periodic waveform.

Some display devices display images by selective illumination within an array of pixels distributed across the viewable area. Image resolution in a rectangular grid of pixels, for example, is sometimes specified in terms of the spacing between adjacent pixels (e.g., 2400 dots per inch (DPI), 130 pixels per inch (PPI)). Depending on the implementation, the selective illumination of each individual pixel can be controlled according to digital values for black and white, grey scale, or color information.

SUMMARY

In exemplary embodiments, a waveform processor system may update pixel state information as a function of current pixel state information (e.g., intensity, color) by comparing a randomized value to a set of predetermined threshold values that correspond to different permitted pixel states. In an illustrative example, each time a display screen is updated, the image may represent multiple (e.g., 2000) triggered sweeps of the waveform. For each triggered sweep, the waveform data is associated with specific pixels on the display screen. To determine how to update each pixel's state (e.g., brightness, color) for the next screen update, each waveform hit on a pixel may initiate a comparison between a randomized value (e.g., pseudorandom number) and the predetermined threshold value for the pixel's current pixel state. In some examples, the pixel state may be increased to the next level if the randomized value exceeds the predetermined threshold value.

In an illustrative example, a waveform processor can process waveform data to be rendered for display on a display device by first associating sections of the waveform data with pixels on a screen of the display device. The sections of the waveform may be identified based on a set of trigger conditions, for example. Each screen update can be based on a number (e.g., up to about 10, 100, 1000, 10,000 or more) triggered events that initiate a mapping of waveform data to particular pixels. Each pixel's intensity for the next screen update can be determined by comparing one or more random values to a set of predetermined threshold values. Each time the waveform data is associated with a particular pixel, that pixel's intensity can be increased to a higher level based on a result of the comparison. In various examples, the threshold value selected for each comparison can be a function of the pixel's intensity.

In an illustrative embodiment, a waveform processor stores a set of twenty four predetermined threshold values corresponding to eight permitted pixel intensities for each of one or more colors. As waveform data is processed for rendering on a display, the waveform data is associated with specific pixels. To update a display having current pixel state (e.g., color, intensity) information, the waveform processor can process subsequent data representing a number of sweeps of a waveform across a display device to determine how many times the waveform data hits on each pixel. For each hit on a pixel, the pixel's intensity level may transition to the next higher intensity level if a randomized value exceeds the predetermined value corresponding to that pixel's current intensity.

In some examples, the predetermined threshold values may be defined substantially so as to reduce the probability of a transition as pixel intensity approaches visual saturation. In some further embodiments, a set of predetermined values may statistically control pixel intensity brightening and/or fading probability as a function of pixel intensity.

In one illustrative aspect, methods of displaying information in a measurement device may include triggering the acquisition of a waveform, acquiring samples of the waveform, associating each sample with a pixel to be displayed on a display device, or generating a substantially random number. The method may further include comparing the generated number to a transition probability vector (TPV) value assigned to a current intensity value of the pixel. The TPV may include a number of predetermined values. The method further includes updating the intensity of the pixel based on a result of the comparison, and controlling the pixel on the display device based on the updated pixel intensity value.

In some examples, the TPV may be accessed by a small number, n, of bits, which may address up to $2^n$ values. For example, if n=3, then the TPV may include 8 different threshold values corresponding to 8 different pixel states. In some embodiments, the current intensity value may be a function of the intensity value from a previous sweep and/or screen update. For example, the intensity value may be increased during a subsequent screen update to increase the intensity of a displayed pixel, or the intensity value may be reduced during an update to fade the intensity of a displayed pixel.

Various embodiments may provide one or more advantages. For example, some embodiments may achieve high speed video rates while consuming reduced processor bandwidth and/or memory access overhead. Some embodiments may update pixel intensity and/or color information with reduced data width and memory space requirements. Some examples may be implemented in whole or in part in synchronous and/or asynchronous hardware, such as an application specific integrated circuit (ASIC) or field programmable gate array (FPGA), which may provide substantially reduced processing time and/or consume fewer computational resources of a central processor unit, for example.

The details of one or more embodiments are set forth in the accompanying drawings and the description below. Other features and advantages will be apparent from the description and drawings, and from the claims.

DESCRIPTION OF DRAWINGS

This document describes these and other aspects in detail with reference to the following drawings.

FIG. 2A shows an example table of values for statistical compression in a transition probability vector (TPV).

FIG. 2B shows an example table of fade probability values.

FIG. 6A shows an example table of display intensity values for the display of statistically compressed and faded waveform data.

FIG. 6B shows an example table of named color values for the display of statistically compressed and faded waveform data.

Like reference symbols in the various drawings indicate like elements.

DETAILED DESCRIPTION OF ILLUSTRATIVE EMBODIMENTS

Figure 1:
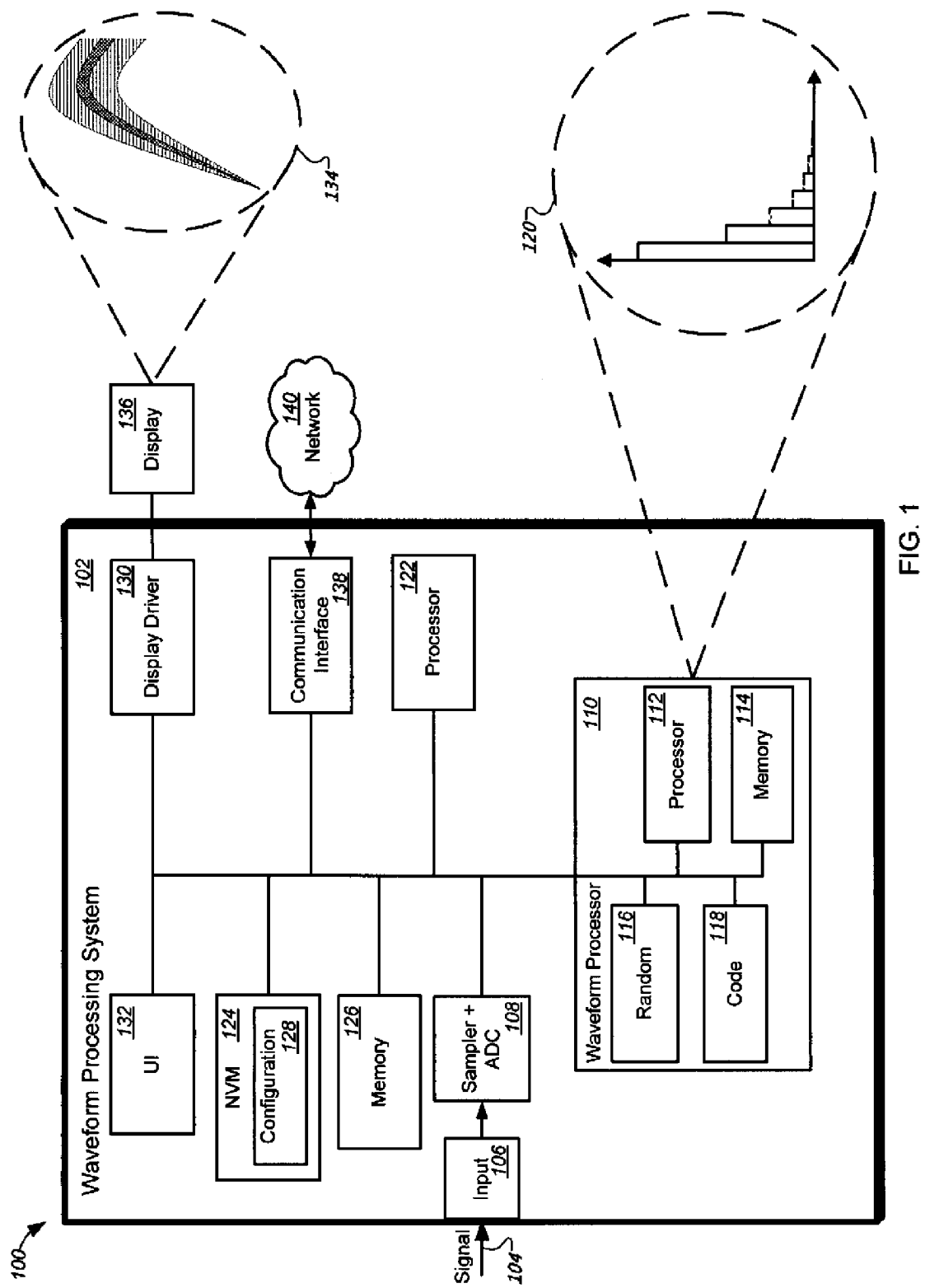
FIG. 1 shows a block diagram of an example system for statistical compression and fade using display value arrays.

FIG. 1 shows a block diagram 100 of an example waveform processing system 102 that is configured to update display information based on the intensity level of the pixel from the previous screen (or pixel) update. In some embodiments, the update may use an approach that may be referred to herein as statistical compression. The waveform processing system may be configured to perform various embodiments of statistical compression, for example, to determine how to update the intensity of each pixel on a display screen each time the displayed pixel on the screen is refreshed (e.g., updated). Various embodiments may compare a number of pixel events since a previous screen (or pixel) update to a randomized value. A result of the comparison may determine whether and to what extent pixel intensity may be changed for a subsequent screen update. In some examples, threshold values may be defined to provide statistical compression by substantially reducing the difference between intensity levels as the intensity levels approach visual saturation.

In one example, a pixel's intensity increases or decreases based on the number of "hits" on that pixel during a screen refresh interval and the pixel's intensity at the time of the previous screen refresh time. For repeatedly triggered waveforms, for example, any particular pixel may be hit many times (e.g., perhaps several thousand times) between screen updates. In such embodiments, the likelihood of an incremental change in the pixel's intensity level from one screen update to the next may be configured to substantially decrease at correspondingly higher levels of pixel intensity. As pixel intensity approaches higher levels (e.g., substantial saturation with reduced incremental visual perceptibility), more hits may be required before the pixel intensity is incremented to a higher level. This may be achieved by comparing a randomized number to a corresponding transition probability that decreases as intensity value increases. As a result, pixel intensity transitions are less likely, or compressed, at higher levels of pixel intensity.

In general, the waveform processing system 102 receives waveforms and processes the waveform data for display to a user. In some modes, the waveform data may be processed using statistical compression and fade operations that may be performed using a limited amount of memory. For example, in some implementations, a user may optionally enable or disable statistical compression to view a waveform display using well-known methods.

In various implementations, waveforms may be defined by a relationship of a set of data samples to a trigger event. The trigger event may be a function of time, voltage, event, or a combination of such parameters.

In an illustrative example, data from multiple successive triggered waveforms may be compiled to form a composite collection of display values to be sent for display on a display screen. Each of the display values may represent the relative number of times that the multiple waveforms have been observed at a particular X (e.g., time, voltage) and Y (e.g., voltage, current, frequency) point. In some examples, the more times a collection of waveforms hits a time and voltage coordinate, the higher the intensity of the pixel associated with that coordinate may become. The display values may be mapped to intensity and/or color values that can be sent to a display device for presentation to the user. In some implementations, the statistical compression and display processes may be considered analogous to a phosphorous analog oscilloscope display; regions of the display that a waveform trace hits often may appear brighter whereas regions that are hit less often may appear darker.

Fade operations may be performed to reduce the pixel intensity values that have been stored in the collection of display values. In some implementations, by reducing the pixel intensity values of the stored display values, the waveform data displayed to the user may appear to fade. For example, the fade operation may be used to emulate the behavior of an analog oscilloscope's screen, e.g., after a trace is drawn on the phosphor screen, the image may begin to fade over time.

In some embodiments, the waveform-processing system 102 may be an oscilloscope, a spectrum analyzer, harmonic analyzer, or other type of waveform measurement device. Various embodiments of the system 102 may be implemented with sampling oscilloscopes, real-time oscilloscopes, or logical analyzers, for example. The waveform-processing system 102 receives an input signal 104, which may be a waveform signal, through an input interface 106. The input interface 106 communicates the input signal 104 to a sampler and analog-to-digital converter (ADC) module 108 to convert the analog input signal 104 into digital samples for processing and/or storage. For example, the module 108 may digitize the amplitude of the input signal 104 over multiple sample periods.

The waveform processing system 102 includes a waveform processor 110 to perform statistical compression and fade operations. For example, the waveform processor may process waveform data digitized by the sampler and ADC module 108 to form a display value array. The waveform processor 110 includes a processor module 112, a memory 114, a random number generator 116, and a code module 118. In some embodiments, the code module 118 may contain instructions for performing statistical compression and fade operations on the processor module 112. The random number generator 116 generates randomized and/or pseudorandom numbers that may be used by the processor module 112. For example, the processor module 112 may compare a pseudo-random number against a transition value to determine if an element of a display value array stored in the memory 114 should be incremented or decremented. Examples of processes for incrementing and decrementing persistence map values are described in further detail with reference to FIGS. 3-5.

The waveform processor 110 uses a collection of transition probability values 120 to perform statistical probability and fade operations. The transition probability values 120 are a collection of values that may be used to define the probability that an element of the display value array may be incremented when a waveform is measured at a time offset and amplitude that the element represents, or to define the probability that the element will be decremented during a fade operation. Examples of transition and fade probability vectors are described in further detail with reference to FIGS. 2A and 2B.

In various implementations, the processor 110 may perform one or more processes of the statistical compression and fade operations in hardware (e.g., FPGA, ASIC, or a combination of these and/or other discrete and/or integrated analog and/or digital components), in software (e.g., firmware or the like), or in a combination of hardware and software.

The waveform processing system 102 of this example also includes a processor 122. The processor 122 may perform various functions, such as supervisory, user interface, signal processing, and/or signal analysis operations. For example, the processor 122 may supervise various operations, such as waveform data collection and user interaction. In various embodiments, the processor 122 may perform statistical analysis operations, such as computing the variance of a set of samples, for example.

In the depicted example, the processor 122 is coupled through a digital bus to memory devices, including a non-volatile memory (NVM) 124 and a memory 126. The NVM 124 may provide a storage space for storing data (e.g., sampled waveform data acquired by the sampler and ADC module 108) and/or executable instructions (e.g., application software). The NVM 124 may include, for example, flash memory, read only memory (ROM), EEPROM, data storage devices with rotating media (e.g., optical or magnetic disc drive), tape storage devices, or any combination of these or other data sources. The memory 126 may provide temporary storage for the sampled signal data from the sampler and ADC module 108. The memory 126 may be, for example, RAM, a buffer, or cache memory, for volatile data storage. In some embodiments, the processor 122 may quickly access the memory 126 to retrieve and/or store data.

In this example, the NVM 124 is coupled to the processor 122 by a digital address/data bus. The NVM 124 also includes a configuration 128 that may contain settings (e.g., coded data) that the waveform processing system 102 may use to perform the statistical compression and fade operations (e.g., the sampling rate for the module 108, trigger information).

The waveform processing system 102 also includes a display driver 130 and a user interface 132. The display driver 130 may format and send images, such as a waveform histogram 134 for display on a display device 136 in the user interface 132. For example, the display driver 130 can send for display samples of one or more statistically compressed and faded waveforms so that an operator can view a representation that visually illustrates one or more input waveforms, such as the measured input signal 104. An operator can use the user interface 132 to input commands and/or information to set-up and/or control operation of the waveform processing system 102. In some embodiments, the operator may use the user interface 132 to input measurement set-up parameters. The set-up parameters may include, for example, a number of periods of the input signal 104 to acquire, acquisition methods, and/or trigger conditions. In another example, the operator may use the user interface 132 to define and/or execute operations to process waveforms data.

For example, the processor 122 can initiate the sampler and ADC module 108 to sample the input signal 104 via the input interface 106. The sampler and ADC module 108 can convert the analog input signal 104 into digital samples and store the digitized data in the memory 126 The processor may 120 also initiate the waveform processor 110 to process the digital samples.

In an illustrative example, a user may input a request to display 1000 instances of a one-second period of the waveform signal 104 that is being sampled at a 1 kHz rate. The code 118 may include instructions that, when executed by the processor 110, cause the processor 110 to perform operations to statistically compress and fade the samples to update an array of display values that may provided to the display driver 130 and displayed on the display 132. In some embodiments, statistical compression and fade operations may be performed to store and display a representation of the 1000 waveforms using an array of 3-bit unsigned integer values. For example, a single display value may require 10 bits to count up to the 1000 times that a waveform may be measured at the time offset and amplitude represented by the display value (e.g., a 10 bit location provides space for 1024 counts). By using statistical compression, the relative number of times any number of waveforms is measured at the single display value may be represented using 2, 3, 4, 8, or other numbers of bits. For example, a 3-bit display value may hold the integer values 0 through 7, where the value 0 may indicate that the waveform or waveforms were not measured at that time offset and amplitude, and a value of 7 may indicate that the waveforms were repeatedly measured for that value.

In system 102, the digital bus is further coupled to a communication interface module 138. The communication interface module 138 communicates with a communications network 140. Statistically compressed and faded waveform data that has been processed by the waveform processor 110 may be sent, for example, to the communications network 140. The communication interface module 138 may send and/or receive data to monitor or control the serial waveform processing system 102 remotely from a node on the communications network 140.

The input interface 106 may include, for example, a connector, antenna, or detector (e.g., photo receiver) suitable to receive the input signal 104. In some applications, the signal 104 may be sensed by an active or passive probe coupled to a transmission line, wireless link, fiber optic waveguide, or other transmission channel or medium. The signal may be sensed, transported, and/or received using, for example, coaxial cable, microstrip, coplanar waveguides, waveguides, ribbon cable, shielded or unshielded twisted pair, optical fiber, antenna, photo-detector, printed circuits, or a combination of any of these or other similar apparatus. In various applications, the input signal 110 may originate from sources that may include, but are not limited to, a signal generator, analog and/or digital circuitry, transceivers (e.g., modem), wired or wireless or fiber optic communications equipment, or other sources.

FIG. 2A shows an example table 200 of statistical compression transition probability values. The table 200 includes a column of bin values, a column of transition vector values, and a column of probability values. In general, each bin represents a value that may be stored in a location in a collection of display values, and the transition vector may be used to determine a probability that the value stored in the collection of display values will be incremented. For example, an array of 3-bit display values may store integer values that may range from zero to seven (e.g., eight total values), and eight bins may be used to associate a transition vector value with each of the possible integer values that may be stored in an element of the display value array.

In some implementations, the values in the collection of display values may be increased by applying statistical compression operations using the transition vector, and the collection of display values may be used to form a visual display of a waveform or waveforms. Example statistical compression operations that may use the transition vector are described in further detail with reference to FIG. 4.

In the illustrated example, the element may start with an initial value of 0. The bin 0 has a corresponding transition vector element $i_0$ that has a probability value of 100%. In some implementations, the probability value may represent the probability that the element value will be incremented when "hit" (e.g., when a waveform is measured at the point represented by the element). For example, the element may have a value of zero and a 100% chance of transitioning to a value of 1 when hit.

In another example, the element may have a value of 3, which corresponds to a transition probability of 0.1%. When the element is hit, the transition probability value may be compared against a randomized or pseudorandom number, and if the pseudorandom number is less than the transition probability value then the element value may be incremented. For example, a pseudorandom number generator (e.g., the random number generator 116 of FIG. 1) may produce a value of 0.0005, which is less than 0.1% (e.g., 0.001), and the element value of 3 may be incremented to a value of 4.

FIG. 2B shows an example table of fade probability values. The table 250 includes a column of bin values, a column of fade vector values, and a column of probability values. In general, each bin represents a value that may be stored in a location in a collection of display values, and the fade vector may be used to determine a probability that the value stored in the collection of display values will be decremented.

In some implementations, a waveform image produced from the collection of display values may be made to fade by applying a fade operation using the fade vector. Example fade operations that may use the fade vector are described in further detail with reference to FIG. 5.

In the illustrated example, an element of the collection of display values may have a value of 5. The bin 5 corresponds to a fade vector element $f_5$, which has a fade probability value of 0.01%. In some implementations, the fade probability value may represent the probability that the element value will be decremented during a fade operation. For example, during a fade operation the fade probability value 0.01% may be compared to a randomized or pseudorandom number. If the number is less than 0.01% (e.g., 0.0001), then the element value of 5 may be decremented to a value of 4. If the number is greater than 0.01%, then the element value may be left unchanged.

Although the example transition and fade vectors shown in tables 200 and 250 are shown using probability values that are based on a collection of logarithmic values, other embodiments can be implemented. For example, transition and/or fade probability values may be selected from a collection of linear, exponential, natural log, Gaussian, randomized, or other (e.g., user-defined) distributions of values.

Figure 3:
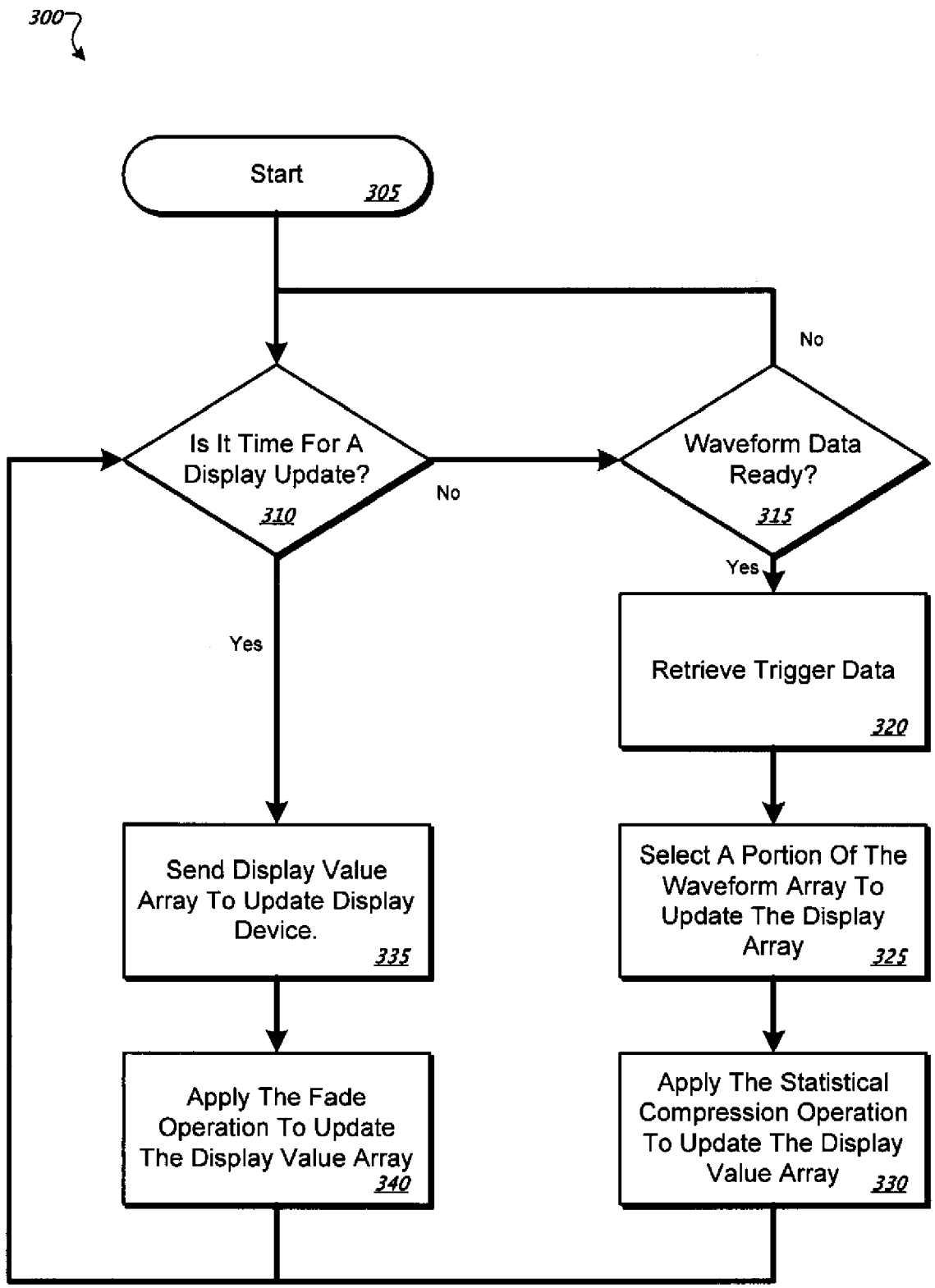
FIG. 3 shows an example process for statistical compression and fade in display value arrays.

FIG. 3 shows an example process 300 for statistical compression and fade in display value arrays. In general, the process 300 may be used to coordinate processes for performing statistical compression operations, fade operations, and providing data for updating a display.

Although the following description makes reference to steps performed by a particular exemplary hardware implementation (e.g., the waveform processor 110 of FIG. 1) for purposes of illustration, other implementations are contemplated. For example, steps of the process 300 may be performed in whole or part by a processor, such as the processor 110. In some embodiments, the processor may be an ASIC, FPGA, RISC, or DSP alone or in combination with other discrete, hybrid, and or integrated circuitry, which may be digital, analog, or a combination thereof.

Some operations relating to the process 300 may be performed by a processor executing a program of instructions. For example, the steps of the process 300 may be performed in whole or part by the processor 122 of FIG. 1. In various embodiments, various steps of the process may be implemented in hardware or, software executed alone or in combination with suitable hardware components. Accordingly, the described processes are not limited to the described illustrative embodiments.

The process 300 may be started 305 in response to a user input (e.g., pressing a button), an electrical trigger, a waveform value, an initialization process (e.g., when a device powers up), or other methods by which a process may be initialized.

At step 310, the waveform processor 110 determines if it is time for a display update. In some embodiments, the display update may be performed at desired intervals by providing an array of display values for a display adapter (e.g., the display adapter 130 of FIG. 1). For example, the display update may be performed on a predetermined, timed interval such as approximately every 16 msec or other fraction of a second, every second, every 5 seconds, every 10 seconds, or other appropriate time interval. In another example, the display update may be performed after a predetermined number of waveforms have been statistically compressed. For example, a display update may be performed once for every about 10, 50, 100, 500, 1000, 2000, 5000, or at least about 1,000,000 or more waveforms that are processed. By way of example and not limitation, a typical refresh rate for a screen in some applications may be between about 20 Hz and about 1 kHz, such as about 50 Hz or about 60 Hz.

If the processor determines 310 that it is not time to perform a display update, then a check is made to determine 315 if waveform data is ready for processing. For example, a statistical compression operation may be performed when a predetermined number of waveform samples (e.g., 128, 480, 800, 1000, 1024, 10,000 or more) have been digitized. If the processor determines 315 that waveform data is not ready, then step 310 is repeated.

If the processor determines that waveform data is ready at step 315, then the processor retrieves a collection of waveform trigger data. In some embodiments, the trigger data may include information about waveform timing, measurements, thresholds, events, patterns, or combinations of these and/or other data that may be used to describe a digitized waveform. For example, the trigger data may include a collection of time offset locations where rising edges of a periodic signal crosses a zero-volt threshold.

The retrieved 320 trigger data is used by the processor to select 325 a portion of the waveform array to update the display array. The processor may select the portion 325 as a function of horizontal resolution, sample speed, sample duration, time base selections, trigger time, or combinations of these or other criteria that may be used to select a portion of a waveform. For example, the portion of the waveform may be selected 325 to update the display array with a one-second period of a waveform that is sampled at a 1 kHz sampling rate.

In some embodiments, the portion of the waveform array may be defined by a trigger point and a predetermined number of pre-trigger and/or post-trigger samples. For example, a trigger data value may indicate the start of a waveform array subset and include the next 1000 elements of the waveform array. In other examples, a portion of a waveform may include a trigger point, 100 samples that precede the trigger, and 1500 samples that follow the trigger. In yet other examples, the waveform portion may include a trigger point and 5000 samples that precede the trigger.

In some embodiments, the portion of the waveform array may not include the trigger data value. For example, the user may magnify (e.g., "zoom in") on a section of a waveform display. The section of the waveform may be magnified by selecting 325 a portion of the waveform data that may or may not include the trigger point.

The processor applies 330 a statistical compression operation to the waveform portion to update the display value array. Example statistical compression operations are described in further detail with reference to FIG. 4. The process 300 then determines 310 if it is time for a display update.

If, at step 310, the processor determines it is time for a display update, then the display value array is sent 335 to update a display device. In some embodiments, the display device may be the display 136 of FIG. 1. A fade operation is then applied 340 to update the display value array. Example fade operations are described in further detail with reference to FIG. 5.

Figure 4:
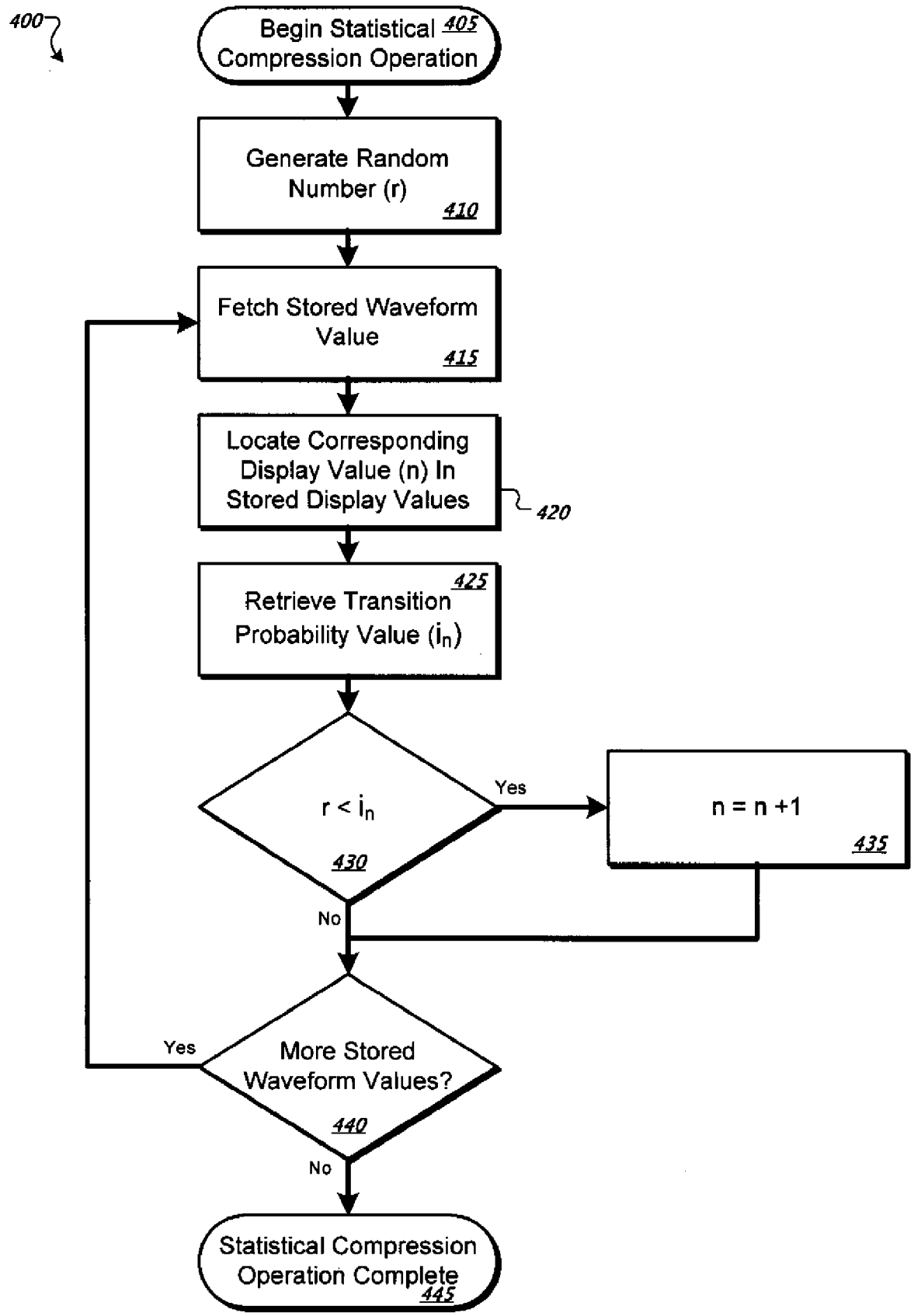
FIG. 4 shows an example process for statistical compression operations.

FIG. 4 shows an example process 400 for statistical compression operations. In some embodiments, the process 400 may be the step of FIG. 3 where a statistical compression operation is applied 330 to update the display value array. The statistical compression operation may begin 405 when the process 400 is called by another process, such as the step 330 of the process 300, for example.

A randomized or pseudorandom value (e.g., number) is generated in step 410. In some embodiments, the randomized number may be generated by a processor executing a program of instructions. In some embodiments, the randomized number may be generated by a randomized number generator, such as the random number generator 116 of FIG. 1. In some embodiments, the randomized or pseudorandom number may be generated 410 once per execution of the process 400. For example, one randomized number may be generated 410 for processing a waveform array. In some embodiments, the randomized or pseudorandom number may be generated 410 for each element of the waveform array that is processed. For example, a set of deterministic instructions may be used to generate a pseudo random number. By way of example, and not limitation, substantially random numbers may also be generated in various embodiments based on timing of a radioactive decay, or by measuring thermal noise that corresponds to random vibration of atoms.

A stored waveform value is fetched 415 from the waveform array. In some embodiments, the fetched 415 waveform value may represent a single digitized waveform amplitude measurement. A corresponding display value is located 420 in an array of stored display values.

A transition probability value that corresponds to the display value is retrieved 425. In some embodiments, the transition probability value may be an element of a transition probability vector, such as the transition probability vector of FIG. 2A. If the randomized number is determined 430 to be less than the transition probability value, then the display value may be incremented 435. For example, a display value of 2 may have a transition probability value of 1%. If the randomized number has a value of less than 0.01, then the display value may be incremented to a value of 3.

If the randomized number is determined 430 to be greater than or equal to the transition probability value, then the display value may be left unchanged. A check is then made to determine 440 if there are more stored waveform values (e.g., samples) to be processed. If more stored waveform values are determined 440 to be available for processing, then another stored waveform value is fetched 415. If no more stored waveform values are determined 440 to be available, then the statistical compression operation 400 ends at step 445.

In some embodiments, the process 400 may be re-run when the waveform selection is changed. For example, the user may alter the time base selection used to select a portion of the waveform. When a different time base or other configuration value is changed, the process 400 may be rerun to update the array of stored display values to reflect the changed waveform selection.

Figure 5:
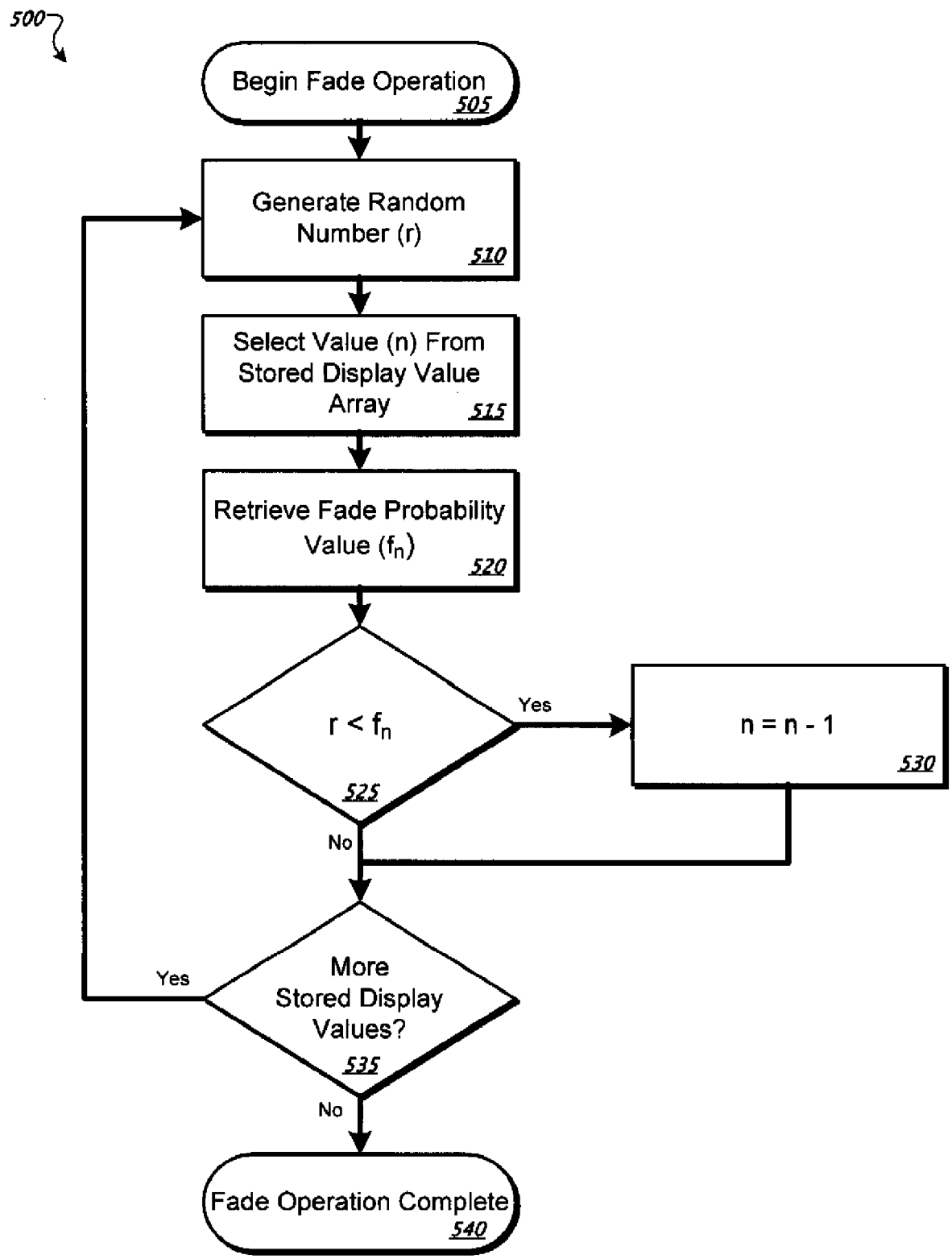
FIG. 5 shows an example process for fade operations.

FIG. 5 shows an example process 500 for fade operations. In some embodiments, the process 500 may be the step of FIG. 3 where a fade operation is applied 340 to update a display value array.

A randomized or pseudorandom number is generated 510. In some embodiments, the randomized or pseudorandom number may be generated 510 for each element of the display value array that is processed. In some embodiments, the randomized or pseudorandom number may be generated 510 once per execution of the process 500. For example, one randomized number may be generated 510 for processing a display value array.

In the method 500, a pixel state value of the nth pixel in the display value array is selected 515. A fade probability value fn is determined 520 based on the selected pixel state. For example, the pixel state may be a value between [0-7], and the corresponding fade probability value may be predetermined for each of the eight available pixel states. In some embodiments, the fade probability value may be an element of a fade probability vector, such as the fade probability vector of FIG. 2B. If the randomized number is determined 525 to be less than the fade probability value, then the display value may be reduced 530, e.g., decremented to a lower pixel state. For example, a pixel state value of 7 may correspond to a fade probability value of 0.0001%. If the randomized number has a value of less than 0.000001, then the display value may be updated by fading the pixel state to a value of 6.

If the randomized number is determined 525 to be greater than or equal to the fade probability value, then the display value is to be left unchanged. A check is then made to determine 535 if there are more stored display values to be processed. If more stored display values are determined 535 to be available for processing, then another randomized or pseudorandom number is generated 510. If no more stored display values are determined 535 to be available, then the fade operation may be complete 540.

FIG. 6A shows an example table 600 of display intensity values for the display of statistically compressed and faded waveform data. In some embodiments, a display and/or display adapter, such as the display 136 and/or the display adapter 130 of FIG. 1, may display grayscale images, and the values in a table such as the table 600 may be used to convert 3-bit display values to 8-bit grayscale intensity values. The table 600 includes a column of bin values, a column of grayscale values, a column of inverted grayscale values, and a column of grayscale anomaly highlight values.

In some implementations, a collection of grayscale values represented by the grayscale column may be used to map display values to grayscale values. For example, display values mapped to the values in the grayscale column may produce a waveform image that is darker in regions that are substantially free of waveform data, and brighter in areas where one or more waveforms have been measured repeatedly.

In some embodiments, grayscale values may be configured to adjust the brightness and/or contrast of the displayed waveform image. For example, display values mapped to the values in the inverted grayscale column may produce a negative image, where the waveform image may be brighter in areas that are substantially free of waveform data, and darker in areas where one or more waveforms have been measured repeatedly.

In some embodiments, grayscale values may be configured to highlight and/or suppress one or more display values. For example, a user may wish to highlight waveform anomalies (e.g., intermittent signals, transients) by using the column of grayscale anomaly highlight values. The column of grayscale anomaly highlight values is configured to show display values with a value of 1 using a substantially bright intensity value, and the remaining display values may be mapped to lesser intensity values. In the illustrated example, a grayscale waveform image with bright traces of anomalous signals may be displayed.

While the example of FIG. 6A has been described as a table of 3-bit display values and 8-bit grayscale values, other embodiments may exist. In some embodiments, other numbers of bits may be used to describe the display and/or grayscale values. For example, the display values may be represented using 2, 3, 4, 8, or other numbers of bits.

In some embodiments, colors may be assigned to bins of display values. For example, a display value may be represented by a combination of two, three, or more integer values, such as an RGB value (e.g., a triplet of 8-bit values representing red, green, and blue intensity values). In another example, a display value may be mapped to a named color value (e.g., blue, purple, pink, orange).

FIG. 6B shows an example table 650 of named color values for the display of statistically compressed and faded waveform data. The table 650 includes a column of bin values, a column of named grayscale values, a column of rainbow values, and a column of color anomaly highlight values. In some embodiments, a display and/or display adapter, such as the display 136 and/or the display adapter 130 of FIG. 1, may display color and/or grayscale images, and the values in a table such as the table 650 may be used to convert 3-bit display values to named color values.

In some implementations, a collection of grayscale values represented by the grayscale column may be used to map display values to named grayscale values. In the illustrated example, dark colors may be used for areas of a waveform image that is substantially free of waveform measurements and light colors may be used in areas where one or more waveforms have been detected.

In some embodiments, display values may be mapped to a spectrum of named colors. For example, display values may be mapped to the column of rainbow values to produce a colored waveform display where each bin of display values may displayed with a different color.

In some embodiments, color values may be selected to highlight and/or suppress the display of one or more bins of display values. For example, display values may be mapped to the column of color anomaly highlight values. The column of grayscale anomaly highlight values may be configured to use the color red for display values with a value of 1, and the remaining display values may be mapped to a collection of grayscale values. In the illustrated example, a grayscale waveform image with red traces of anomalous signals may be displayed.

Although various implementations have been described, further embodiments and features are contemplated. For example, statistical compression and fade operations may be incorporated into various test and measurement equipment to display waveform information. Exemplary equipment may include, but is not limited to, oscilloscopes (e.g., sampling, digital storage), logic analyzers, spectrum analyzers, protocol analyzers, signal analyzers (e.g., for audio, video, optical, radio frequency signals, and the like), data compression (e.g., for storage, transmission, and the like), data rate converters, or other equipment that processes over-sampled data. Some implementations of a waveform processor (e.g., including hardware and/or firmware or software) may be adapted to be retrofit into equipment to accommodate, for example, enhanced waveform display capabilities, without requiring a corresponding increase in data storage capacity.

Various embodiments may include aspects of a computer. The essential elements of a computer are a processor for executing instructions and one or more memories for storing instructions and data. Suitable processors for the execution of a program of instructions include, by way of example, both general and special purpose microprocessors, which may include a single processor, or multiple processors in combination. The processor and the memory can be supplemented by, or incorporated in, ASICs (application-specific integrated circuits). Generally, a processor will receive instructions and data from a data store, such as a read-only memory (ROM), a random access memory (RAM), or both.

Generally, a computer will also include, or be operatively coupled to communicate with, one or more mass storage devices for storing data files. Storage devices suitable for tangibly embodying computer program instructions and data may include volatile and/or non-volatile memory (NVM), which may include, but is not limited to, semiconductor memory devices (e.g., RAM, EPROM, EEPROM, NAND flash, NOR flash, thumb drives), magnetic disks (e.g., hard disc drives), magneto-optical and/or optical media (e.g., CD, DVD).

In some implementations, one or more user-interface features may be custom configured to perform specific functions. Various embodiments may be implemented in a computer system that includes a graphical user interface and/or an Internet browser. To provide for interaction with a user, some implementations may be implemented on a computer having a display device, such as a CRT (cathode ray tube) or LCD (liquid crystal display) monitor for displaying information to the user, a keyboard, and a pointing device, such as a mouse, stylus, or a trackball by which the user can provide input to the computer.

In various embodiments, systems such as the waveform processing system 102 may communicate using suitable communication methods, equipment, and techniques. For example, the waveform processing system 102 may communicate with a portable computer, network server, or other device using point-to-point communication in which a message is transported directly from the source to the receiver over a dedicated physical link (e.g., fiber optic link, point-to-point wiring, and daisy-chain). Other embodiments may transport messages by broadcasting to all or substantially all devices that are coupled together by a communication network, for example, by using omni-directional radio frequency (RF) signals, while still other embodiments may transport messages characterized by high directivity, such as RF signals transmitted using directional (i.e., narrow beam) antennas or infrared signals that may optionally be used with focusing optics. Still other embodiments are possible using appropriate interfaces and protocols such as, by way of example and not intended to be limiting, RS-232, RS-422, RS-485, 802.11 a/b/g, Wi-Fi, Ethernet, IrDA, FDDI (fiber distributed data interface), token-ring networks, or multiplexing techniques based on frequency, time, or code division. Some implementations may optionally incorporate features such as error checking and correction (ECC) for data integrity, or security measures, such as encryption (e.g., WEP) and password protection.

In some embodiments, each memory may be programmed with the same information and be initialized with substantially identical information stored in non-volatile memory. In other embodiments, one or more devices may be custom configured to perform specific functions.

A number of implementations have been described. Nevertheless, it will be understood that various modifications may be made without departing from the spirit and scope. For example, advantageous results may be achieved if the steps of the disclosed techniques were performed in a different sequence, if components in the disclosed systems were combined in a different manner, or if the components were replaced or supplemented by other components. The functions and processes (including algorithms) may be performed in hardware, software, or a combination thereof, and some implementations may be performed on modules or hardware not identical to those described. Accordingly, other implementations are within the scope of the following claims.

What is claimed is:

1. A method for processing waveform information to update an image being displayed on a display device, the method comprising:
receiving sampled waveform data to be rendered as an image on a display device;
associating at least a portion of the sampled waveform data with a pixel of the display device to form an image of the portion of the sampled waveform data;
receiving state information for the pixel, the received state information comprising a value corresponding to one of a finite number of available states, each state defining a parameter for controlling display of the pixel;
providing a transition probability vector (TPV) comprising a plurality of predetermined threshold values corresponding to the available pixel states;
comparing a substantially random value to the predetermined threshold value that corresponds to the received state information for the pixel;
updating the pixel state based on a result of the comparison; and,
storing a control signal for controlling the pixel on the display device according to the updated pixel state;
wherein the predetermined threshold values in the TPV are defined substantially so as to reduce the probability of a transition as pixel intensity approaches visual saturation.

2. The method of claim 1, wherein the pixel state information comprises a parameter for controlling an intensity for displaying the pixel.

3. The method of claim 1, wherein the pixel state information value comprises a parameter for controlling a color for displaying the pixel.

4. The method of claim 1, further comprising triggering the acquisition of the waveform and acquiring samples of the waveform.

5. The method of claim 1, further comprising generating the substantially random number.

6. The method of claim 1, wherein the TPV comprises up to 2 to the Nth values, where N is an integer.

7. A method for processing waveform information to update an image being displayed on a display device, the method comprising:
receiving sampled waveform data to be rendered as an image on a display device;
associating at least a portion of the sampled waveform data with a pixel of the display device to form an image of the portion of the sampled waveform data;
receiving state information for the pixel, the received state information comprising a value corresponding to one of a finite number of available states, each state defining a parameter for controlling display of the pixel;
providing a transition probability vector (TPV) comprising a plurality of predetermined threshold values corresponding to the available pixel states;
comparing a substantially random value to the predetermined threshold value that corresponds to the received state information for the pixel;
updating the pixel state based on a result of the comparison;
fading the pixel intensity by:
providing a fade transition probability vector (FTPV) comprising a plurality of predetermined threshold values corresponding to the available pixel states; and
comparing a second substantially random value to the predetermined threshold value in the FTPV that corresponds to state information for the pixel; and
storing a control signal for controlling the pixel on the display device according to the updated pixel state.

8. The method of claim 7, wherein the predetermined threshold values in the FTPV are defined substantially so as to reduce the probability of a transition as pixel intensity approaches visual saturation.

9. The method of claim 7, wherein at least one of the predetermined threshold values of the FTPV are the same as the predetermined threshold values of the TPV.

10. The method of claim 7, wherein the pixel state information comprises a parameter for controlling an intensity for displaying the pixel.

11. The method of claim 7, wherein the pixel state information value comprises a parameter for controlling a color for displaying the pixel.

12. The method of claim 7, further comprising triggering the acquisition of the waveform and acquiring samples of the waveform.

13. The method of claim 7, further comprising generating the substantially random number.

14. The method of claim 7, wherein the TPV comprises up to 2 to the Nth values, here N is an integer.

15. A method of operating a waveform processing system to update pixels for display, the method comprising:
storing sampled waveform data for processing and subsequent display on a display device, wherein the sample waveform data has a sample period that is substantially shorter than a period of time between screen refreshes on the display device;
storing pixel state information representing display information for at least a portion of the sampled waveform;
storing a plurality of predetermined threshold values, each value being associated with a different pixel state;
identifying a pixel having state information to be updated;
selecting the stored predetermined threshold value associated with the pixel state of the identified pixel;

determining whether to update to the pixel state of the identified pixel based on a comparison of a substantially randomized value to the selected predetermined threshold value;

fading a pixel intensity based upon a comparison of a second substantially random number to a second predetermined threshold value; and generating a signal for controlling a pixel on a display device in response to the updated pixel state information;

wherein the pixel state information comprises an intensity value for displaying the identified pixel.

16. The method of claim 15, further comprising storing the generated signal for subsequent retrieval to control the display device.

17. The method of claim 15, further comprising incrementing the state of the identified pixel upon determining to update the pixel state.

18. The method of claim 15, further comprising decrementing the state of the identified pixel upon making the determination to update the pixel state.

19. The method of claim 15, further comprising determining whether to increment or to decrement the state of the identified pixel based on whether the pixels used to represented the display information include the identified pixel.

20. The method of claim 15, further comprising generating the randomized value.

21. The method of claim 15, wherein the pixel state information value comprises a color value for displaying the pixel.

22. A method for processing waveform information to update an image being displayed on a display device, the method comprising:

providing a display device configured to update a display on a screen comprising an array of pixels once every predetermined screen refresh period;

providing a data store containing information representing sampled waveform data;

triggering sweeps based on predetermined trigger conditions;

for a plurality of the sweeps triggered during the predetermined screen refresh period, associating a portion of the sampled waveform data with pixels across the screen;

for each incidence of a pixel being associated with waveform data during the screen refresh period, updating the pixel's intensity information by:
  (i) identifying a random value;
  (ii) comparing the identified random value to a predetermined threshold value associated with the pixel's intensity; and
  (iii) increasing the pixel's intensity if one or more predetermined promotion criteria are met based on the comparison;

for each pixel for which there is no incidence of being associated with waveform data during the screen refresh period, updating the pixel's intensity information by:
  (iv) identifying a second random value;
  (v) comparing the identified random value to a second predetermined threshold value associated with the pixel's intensity; and
  (vi) decreasing the pixel's intensity if one or more predetermined promotion criteria are met based on the comparison;

storing the updated pixel intensity information in a data store; and generating signals to refresh the screen by controlling one or more intensities in the array of pixels based on the updated pixel intensity information.

23. The method of claim 22, further comprising sampling the sampled waveform data.

24. The method of claim 22, wherein the intensity of each pixel is initialized for each screen refresh period based on that pixel's intensity from the previous screen refresh period.

* * * * *